United States Patent [19]

Wu

[11] Patent Number: 5,075,237
[45] Date of Patent: Dec. 24, 1991

[54] PROCESS OF MAKING A HIGH PHOTOSENSITIVE DEPLETION-GATE THIN FILM TRANSISTOR

[75] Inventor: Biing-Seng Wu, Tainan, Taiwan

[73] Assignee: Industrial Technology Research Institute, Hsinchu, Taiwan

[21] Appl. No.: 558,772

[22] Filed: Jul. 26, 1990

[51] Int. Cl.⁵ ............................................. H01L 21/441
[52] U.S. Cl. ........................................... 437/2; 437/40; 437/43; 437/101; 437/181; 148/DIG. 1; 148/DIG. 150; 357/23.7
[58] Field of Search ...................... 437/2, 3, 4, 40, 41, 437/101, 48, 193, 21, 43, 181; 148/DIG. 1, DIG. 150; 357/4, 23.7

[56] References Cited

U.S. PATENT DOCUMENTS

| | | | |
|---|---|---|---|
| 4,546,009 | 10/1985 | Exxon et al. | 427/39 |
| 4,601,097 | 7/1986 | Shimbo | 437/60 |
| 4,738,749 | 4/1988 | Maurice et al. | 437/181 |
| 4,778,560 | 10/1988 | Takeda et al. | 437/181 |
| 4,788,157 | 11/1988 | Nakamura | 148/DIG. 150 |
| 4,797,108 | 1/1989 | Crowther | 437/101 |
| 4,819,038 | 4/1989 | Alt | 357/4 |
| 4,960,719 | 10/1990 | Tanaka et al. | 437/40 |

OTHER PUBLICATIONS

Wu, B. S., et al., "Amorphous Silicon Phototransistor on a Glass Substrate", *IEEE Trans. on Electron Devices*, vol. ED-32, No. 11, Nov. 1985, pp. 49-53.

*Primary Examiner*—Brian E. Hearn
*Assistant Examiner*—T. N. Quach
*Attorney, Agent, or Firm*—George O. Saile

[57] ABSTRACT

Disclosed is a process for making a thin film transistor photodetector which has the combined merits of the photodiode and the photoconductor without their problems. The resulting device of this process has an accumulation gate on the bottom of the active semiconductor layer and a transparent depletion gate on the top of the active semiconductor layer. The gate length of the depletion gate is smaller than that of the accumulation gate.

10 Claims, 4 Drawing Sheets

PROCESS OF MAKING A HIGH PHOTOSENSITIVE DEPLETION-GATE THIN FILM TRANSISTOR

RELATED APPLICATION

U.S. patent application Ser. No. 389,227 filed Aug. 3, 1989 by the same inventor B. S. Wu.

BACKGROUND OF THE INVENTION (1) Field of the Invention

The invention relates to a process for the manufacture of a highly photosensitive amorphous silicon thin film phototransistor and the resulting phototransistor.

(2) Description of Related Prior Art

The various known techniques for making large area thin film photodetectors include the use of amorphous silicon semiconductor, because the deposition temperature is low enough that it can be deposited on a glass substrate. A glass substrate is preferred since it allows the formation of a large area photodector. In almost all cases up to the present time, the resulting device structure is either a photodiode or a photoconductor.

The photodiode exhibits low dark current, because the diode is a reverse biased PN junction or is inserted between the amorphous silicon layer and the electrode. In the photodiode the photocurrent is a primary current that saturates with unity collection efficiency. This, of course gives an optical gain of less than one.

In the case of the photoconductor sensor, the electrode is ohmic where carrier replenishment occurs. electron photoconductivity is the dominant mode. The photocurrent is a secondary current. Photocurrent and photoconductive gain is proportional to the mobility lifetime product of amorphous silicon. This gives a photoconductive gain of about ten. To increase this gain, a linear sensor with interdigital geometry structure may be added to produce a gain as high as much as 1000. However, the dark current of the photoconductor, which increases proportional to the applied voltage is much larger than the photodiode.

Recently an amorphous silicon photo transistor has been suggested in the article "Amorphous Silicon Phototransistor on a Glass Substrate" by B. S. Wu et al and publishes in IEEE Transactions on Electron Devices, Vol.ED-32, No.11, November 1985 pages 49-53. In this article an amorphous silicon $N+\text{-}IP+\text{-}IN+$ thin film phototransistor on a glass substrate is described. However, in order to increase optical gain of the phototransistor, a very thin base layer must be used in the phototransistor. Therefore, the emitter-base potential is not high enough to block the electron flux which is emitted from the emitter to the collector. The dark current is still very high in this phototransistor.

SUMMARY OF THE INVENTION

The object of the present invention is to describe a manufacturing process for a thin film transistor photodetector which has the combined merits of the photodiode and the photoconductor without their problems. The resulting device of this process has a accumulation gate on the bottom of the active semiconductor layer and a transparent depletion gate on the top of the active semiconductor layer. The gate length of the depletion gate is smaller than that of the accumulation gate.

The preferred process for making such a thin film transistor photodetector with both accumulation and depletion gates begins with the step of forming an opaque accumulation gate electrode on a glass substrate. The accumulation gate material is typically chromium. The bottom insulating layer is now formed over the substrate and the gate electrode. An amorphous silicon layer is formed upon the bottom insulating layer. A top insulating layer is now formed over the amorphous layer. Lithography and etching techniques are used to pattern the top insulating layer down to the amorphous silicon layer of the thin film transistor. This opens the source-drain regions in the amorphous silicon layer. An N+ amorphous silicon layer is formed thereover and is patterned by conventional lithography and etching techniques. The N+ amorphous silicon layer is etched until the top insulator layer between the source-drain regions is exposed and the bottom insulating layer beyond the thin film transistor is bare. A conductive film is deposited over the entire wafer. The conductive film is patterned by lithographic and etching techniques to form the depletion gate electrode and source-drain electrode in this film. The structure is now connected as a photodetector. The photodetector structure is normally repeated many times on the glass substrate as is understood in the art to form a photodetector array.

DESCRIPTION OF THE PREFERRED EMBODIMENTS

Figure 1:
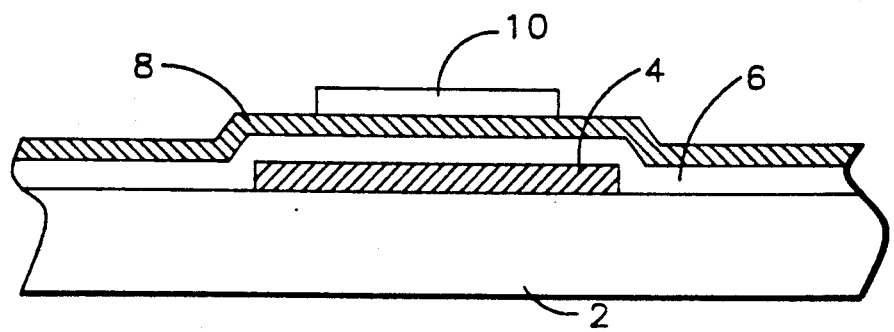
FIGS. 1 through 6 are cross-sectional views of the sequential process steps that will produce the thin film transistor photodetector of the present invention.

Referring now more particularly to FIG. 1, there is shown a glass layer 2 which has been chosen to withstand the temperatures that will be used in the subsequent processing steps. The first steps in the process involve the formation of the accumulation gate electrode 4. The electrode is formed by depositing by sputtering or Chemical Vapor Deposition (CVD) the electrode material onto the substrate 2 to a appropriate thickness of between about 100 to 300 nanometers and preferably 200 micrometers. The material preferred is chromium, but other materials such as may be used. Conventional lithography and etching techniques can now be employed to pattern the material to its final structure shown in the FIG. 1.

The next three elements shown in FIG. 1, that is the bottom insulating layer 6, the amorphous silicon layer 8 and to insulator layer 10 are preferably deposited sequentially in a standard plasma enhanced CVD reactor. Obviously, however they could alternatively be formed in separate steps using different equipment. During the deposition of the insulating layers 6 and 10, the conditions of the deposition were a flow of ammonia and silane with a ratio of 10 to 1 ammonia to silane, an R.F. power of about 300 W., a substrate of about 300° C., and a pressure of about 0.4 Torr. to produce the silicon nitride insulating layers. The thickness of these layers are between about 400 to 250 nanometers and preferably about 300 nanometers. In the case of the deposition of undoped hydrogenated amorphous silicon layer 8, the conditions were a silane flow rate of about 40 sccm., an R.F. power of about 75 W., a substrate temperature of about 280° C. and a pressure of about 0.4 Torr. The thickness of the undoped hydrogenated amorphous silicon layer 8 is between about 100 and 200 nanometers and preferably about 100 nanometers.

The resulting structure is removed from the plasma enhanced CVD equipment and prepared for the patterning of the top insulating layer 10. The surface is prepared and processed by the standard lighography and etching procedures to produce the desired patterned layer 10 as shown in FIG. 1.

Figure 2:
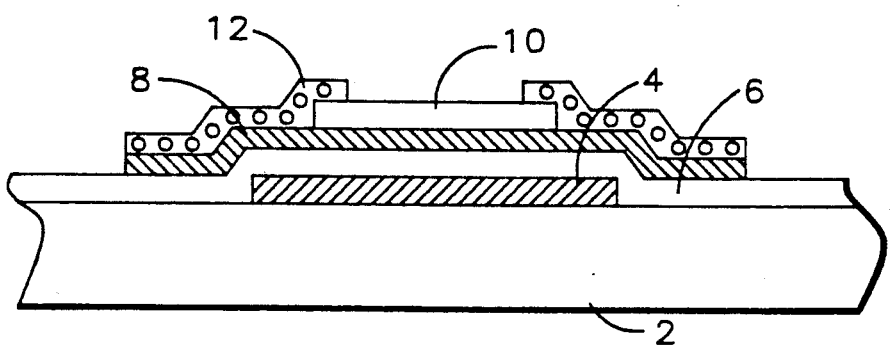

An N+ doped amorphous silicon layer 12 is formed over top insulating layer 10 and the undoped amorphous silicon layer 8. This layer is preferably formed in the plasma enhanced CVD apparatus described in the above paragraphs for forming the amorphous silicon layer 8 with the addition of appropriate doping material which is typically phosphorus as an N+ dopant. The preferred conditions a dilute phosphine gas of less than about 1% in hydrogen to silane gas with a one to one flow ratio, R.F. power of about 75 W., substrate temperature of about 280° C. and a pressure of 0.4 Torr. The thickness of the layer 12 is between about 50 to 100 nanometers and preferably about 50 nanometers. Lithography and etching techniques are used to pattern the amorphous silicon layers 8 and 12 down to the top insulating layer 10 and the bottom insulating layer 6 resulting in the FIG. 2 structure.

Figure 3:
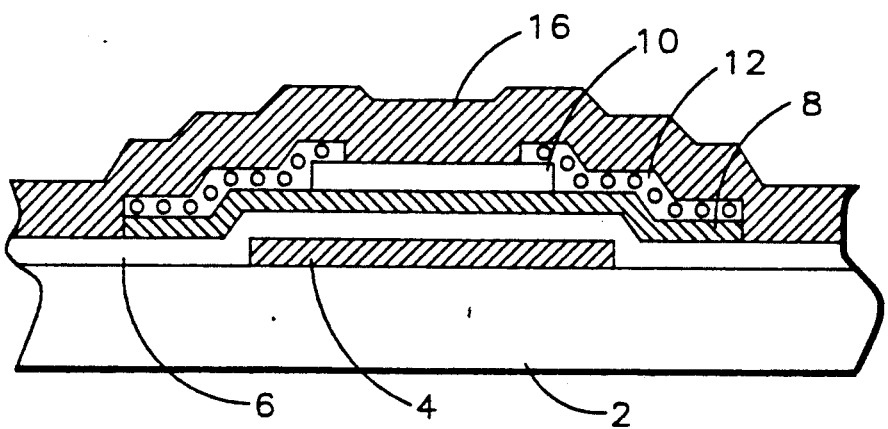

The next steps in the process involve the formation of the conductive film layer 16. This film is preferably indium tin oxide (ITO) or similar transparent, conductive film that has low resistivity and good transparency. This ITO film can be formed by various methods. Sputtering has been a principal method for the ITO formation. It is possible to deposit such a film by D.C. or R.F. sputtering using an Indium oxide and Tin oxide target of the correct proportions to use a Tin and Indium target with a reactive Oxygen sputtering ambient to produce the ITO metal film 16. The thickness of the conductive film 16 is between about 100 to 200 nanometers and preferably about 100 nanometers. FIG. 3 shows the resulting structure of this process.

Figure 4:
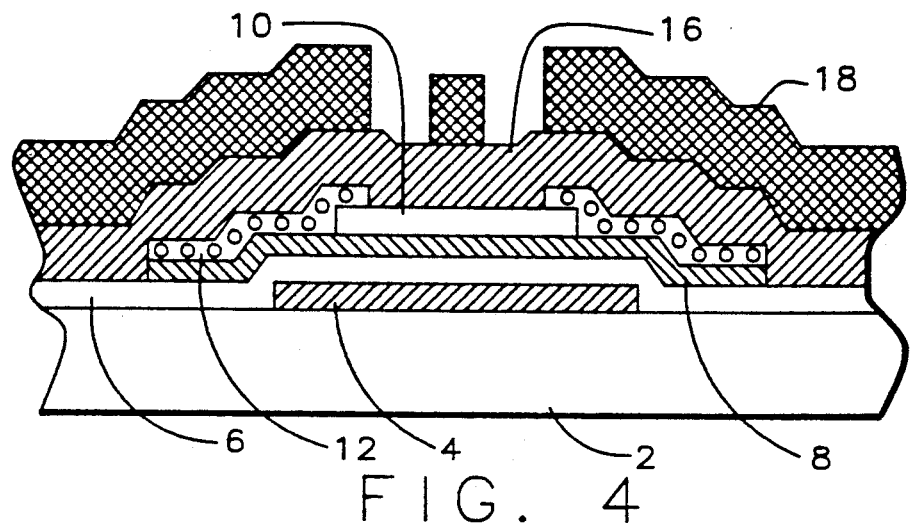
Figure 5:
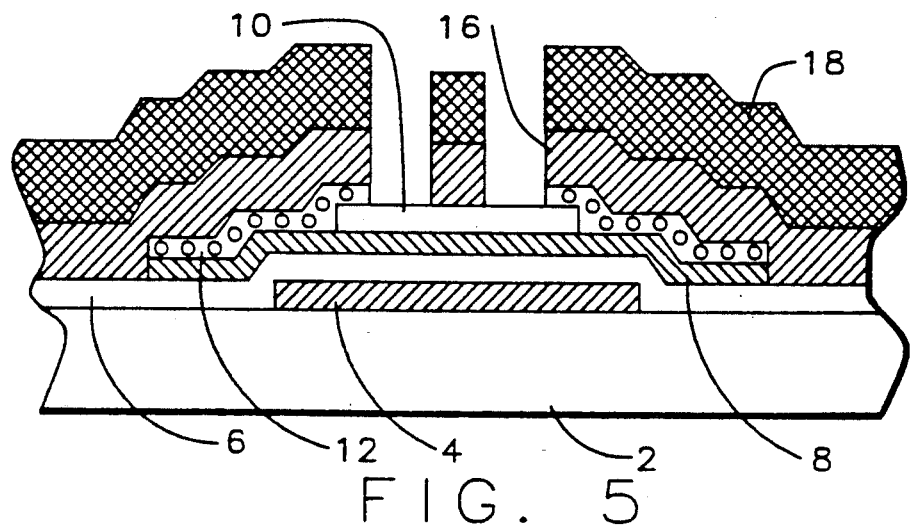
Figure 6:
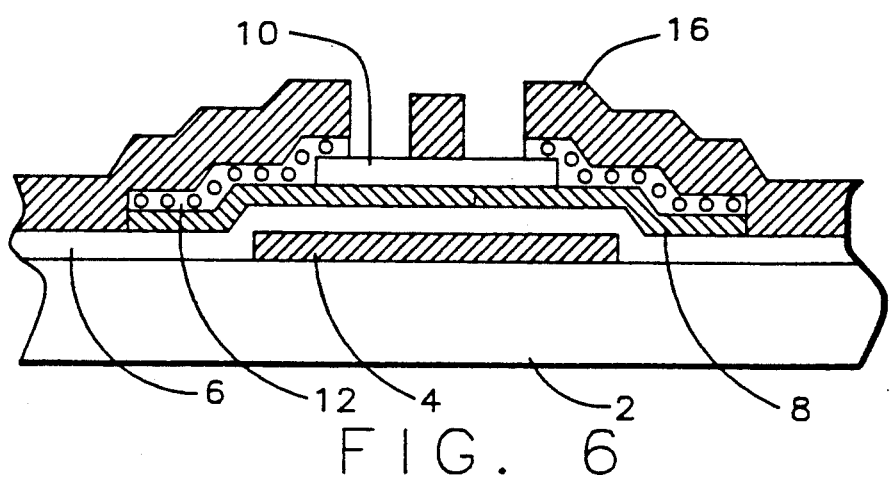

Referring to FIG. 4, there is shown the resist layer 18 which has been exposed to the required radiation through a mask, developed and etched to provide the resist mask that will be used to pattern the conductor layer or film 16. The result of this etching process for conductor layer 16 is shown in FIG. 5 with the resist layer 18 in place. The resist layer is now removed by conventional etching or ashing techniques to produce the thin film transistor photodetector of the present invention as shown in FIG. 6.

This photosensing device can be incorporated into any desired high speed and low-cost photosensing application as is well understood by those skilled in the art. These applications will require higher level connective layers and arrays which are not shown here because they are beyond the scope of this invention.

Figure 7:
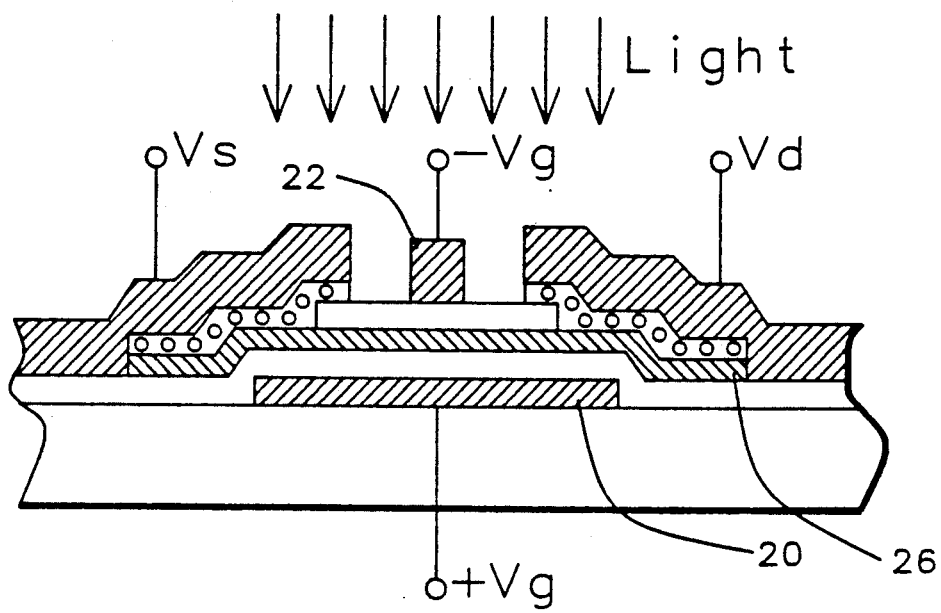
FIG. 7 is a cross-sectional view of the resulting device of the present process which is helpful in understanding the operation of the thin film transistor photodetector.

The operation of the thin film transistor photodetector can be understood with reference to FIG. 7. The accumulation gate 20 is positive biased at +Vg, for example 20 volts and the depletion gate 22 is negative biased —Vg, for example —25 volts with respect to the source electrode Vs. The electrons are accumulated in the active undoped layer 26 by applying a positive bias to the accumulation gate 20. However, the accumulated electrons below the depletion gate 22 are depleted when a negative bias is applied to the depletion gate. Under dark conditions, the depletion gate-voltage-induced depletion layer in the accumulation region has a potential energy minimum or "well" within the accumulation layer which contains a negligible density of thermally generated free electrons. The electrons injected from the source will be blocked by the potential well, hence, the dark current is negligible. The dark current of the detector is much smaller than that of the photoconductor which is controlled by the sheet resistance of the undoped silicon layer. The vertical field, which increases with the voltage difference between the top gate and bottom gate, is much larger than the horizontal field, which increases with the drain to source voltage. Hence, the clearance between the depletion gate and the drain region does not change the current-voltage characteristic of the device. That is, the clearance does not affect the performance of the detector. Under light illumination as shown by the arrows in FIG. 7, the photogenerated electron-hole pairs in the active undoped amorphous silicon layer are separated by the vertical field. The excess holes are swept toward the depletion gate and he excess electrons are swept toward the accumulation gate. The accumulated electrons will lower the potential well, that is the Fermi level is closer to the conduction band edge than during dark condition and the injected electrons can be conducted to the drain.

EXAMPLE

A thin film transistor photodetector was made according to the processes described above to produce the FIGS. 6 and 7 structure. The glass substrate 2, the accumulation gate 4 was composed of chromium of a thickness of 200 nanometers, the bottom insulating layer 6 was composed of PECVD formed silicon nitride of a thickness of 300 nanometers, the hydrogenated undoped amorphous silicon layer 8 was composed of PECVD formed silicon of a thickness 100 nanometers, the top insulating layer 10 was composed of PECVD formed silicon dioxide of a thickness of 300 nanometers, the N+ doped amorphous silicon layer 12 was composed of PECVD formed silicon of a thickness of 80 nanometers, and the conductive layer 16 was composed of a formed layer of aluminum formed layer of 500 nanometers.

Figure 8:
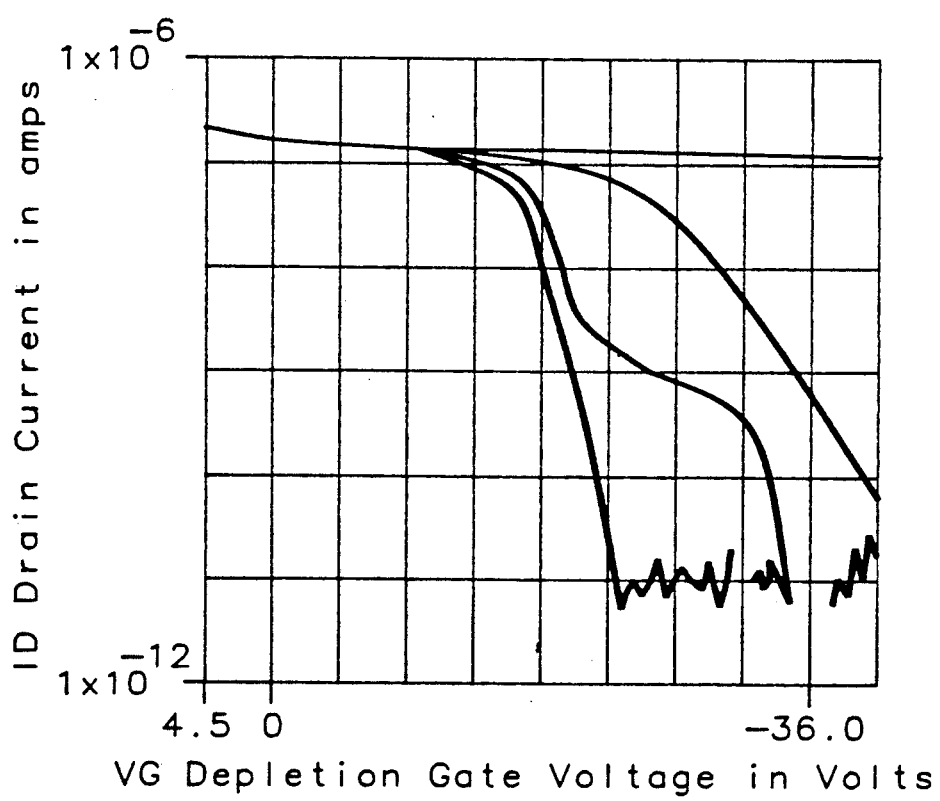
FIGS. 8 through 10 are graphical representations that illustrate the advantages of the present process and resulting thin film transistor photodetector.
Figure 9:
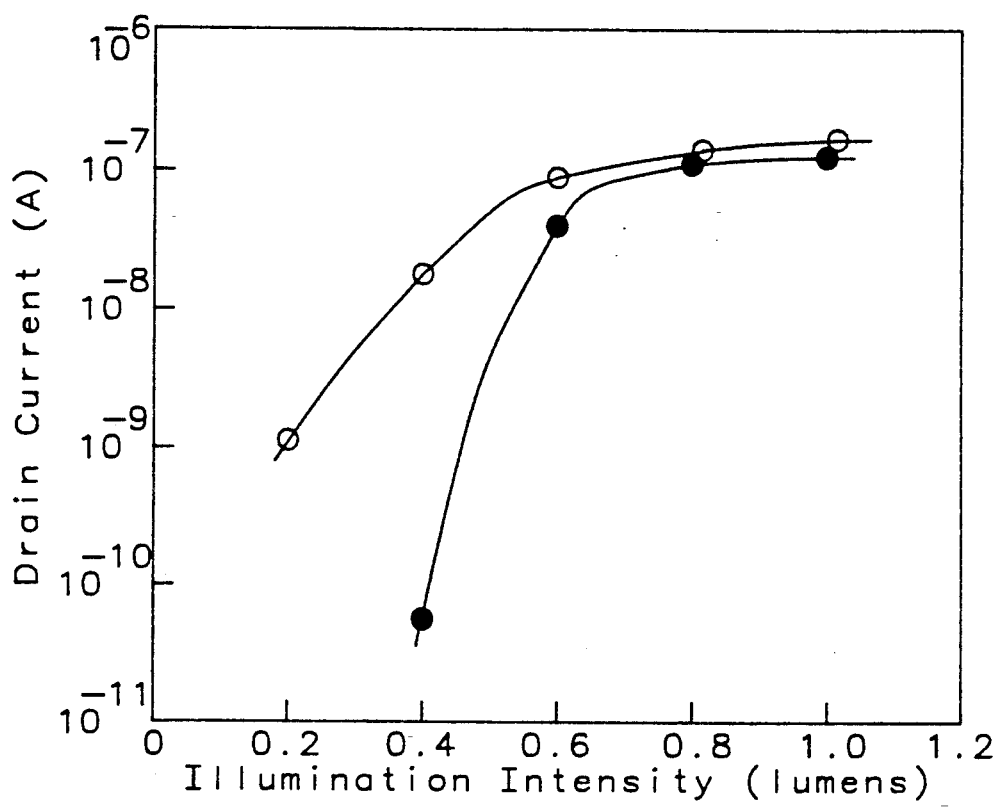
Figure 10:
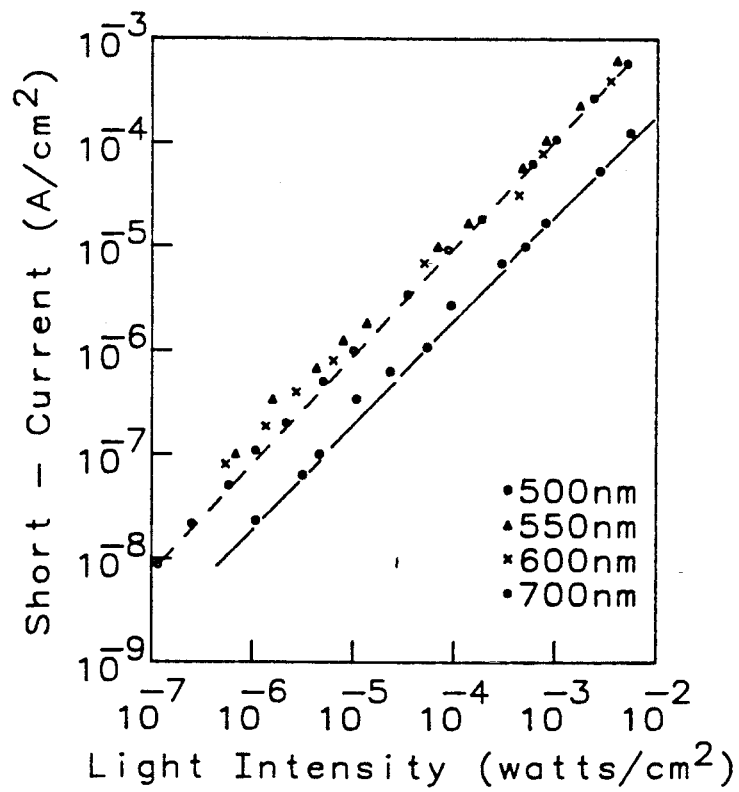

The device was tested using the step up of the FIG. 7. FIG. 8 shows the I-V characteristics of the detector under different illumination conditions. The curve that becomes almost vertical is at dark conditions. The next curve moving to higher drain current is at 0.2 lumens, then at 0.4 lumens, 0.6 lumens, 0.8 lumens and the last curve which is substantially at constant drain current is a 1.0 lumens. FIG. 9 shows the drain current of the device at the depletion gate voltage of —25 volts (upper curve) and —40 volts (lower curve) for various illuminated conditions in luxs. FIG. 10 shows the short circuit current of conventional amorphous silicon photodiode under different light intensity. This FIG. 10 curve was taken from the book "Amorphous Semiconductor, Techologies & Devices" by Y. Hamkawa and published by Ohmsha LTD. and North-Holland Plubishing Company, 1982, page 124. In FIG. 9, the light source is a fluorescent lamp, and the illumination intensity of one lux is about $1 \times 10^{-6}$ watts/cm$^2$. The active region of the device is 5 micrometers by 100 micrometers (depletion gate region). Even with this relatively small size, a $1 \times 10^{-7}$ Amp. drain current can be obtained.

Although the top electrode (depletion gate) is made of aluminum, most of the photons are reflected from the surface of the aluminum, and cannot be absorbed in the depletion region of the device. Nevertheless, a very high drain current can be obtained. We conclude that there are some photons absorbed in the potential minimum region when the device is illuminated. The source of the absorbed photons may come from (1) a few percent of the incident photons penetrate through the top gate and (2) incident photons reflected by the accumulation gate. The optical gain is expected to improve sharply when a transparent conductive film replaces the aluminium conductive film.

While the invention has been particularly shown and described with reference to the preferred embodiments thereof, it will be understood by those skilled in the art that various changes in form and details may be made without departing from the spirit and scope of the invention.

What is claimed is:

1. The method for fabricating an array of thin film transistor photodetectors comprising:
   providing a substrate;
   forming an array of accumulation gates upon said substrate;
   forming a bottom insulating layer over each of said accumulation gates;
   forming an undoped amorphous silicon layer upon said bottom insulating layer;
   forming a top insulating layer over the said amorphous silicon layer;
   patterning said top insulating layer to leave said top insulating layer over that portion of the said amorphous silicon layer designated to be the channel region of the thin film transistor photodetectors and leaving exposed the regions of said amorphous silicon layer designated to be the source and drain regions of said photodetectors;
   forming a layer of doped amorphous silicon over said top insulating layer and the exposed source and drain regions of said photodetectors;
   patterning the layer of doped amorphous silicon until the remaining top insulating layer is exposed and the bottom insulating layer in each photodetector is exposed by etching also through the said undoped amorphous silicon layer which produces ohmic contacts to said exposed source and drain regions;
   forming a patterned conductive film which constitutes the depletion gate electrodes and the source-drain electrodes for the said thin film transistor photodetectors; and
   connecting said photodetectors in the said array.

2. The method of claim 1 wherein the said substrate is a glass substrate which is capable of withstanding temperature required for subsequent processing.

3. The method of claim 1 wherein the said undoped amorphous silicon layer is hydrogenated and the patterned amorphous silicon layer has portions of the source-drain designated regions which overlap said accumulating gates.

4. The method of claim 1 wherein the said bottom insulating layer, the said undoped amorphous insulating layer and said top insulating layer are sequentially formed within the same piece of equipment.

5. The method of claim 4 wherein the said equipment provides plasma enhanced chemical vapor deposition processes which produces the three said layers.

6. The method of claim 5 wherein the said bottom insulating layer is silicon nitride, the said undoped amorphous silicon layer is hydrogenated, and the top insulating layer is silicon nitride.

7. The method of claim 1 wherein the said doped amorphous silicon layer is N+ doped, the thickness of said top and bottom insulating layers are between about 200 to 400 nanometers, the thickness of said undoped amorphous silicon layer is between about 100 to 200 nanometers, the thickness of said doped amorphous silicon layer is between about 50 to 150 nanometers.

8. The method of claim 1 wherein the said depletion gate electrodes and source-drain electrodes for said thin film transistor photodetectors are composed of a substantially transparent material.

9. The method of claim 8 wherein the substantially transparent material is indium tin oxide.

10. The method of claim 1 wherein the distance separating the source-drain electrodes is substantially larger than the size of the depletion gate electrode.

* * * * *